United States Patent
Rofougaran

(10) Patent No.: US 8,995,912 B2
(45) Date of Patent: Mar. 31, 2015

(54) TRANSMISSION LINE FOR AN INTEGRATED CIRCUIT PACKAGE

(71) Applicant: Broadcom Corporation, Irvine, CA (US)

(72) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 199 days.

(21) Appl. No.: 13/725,051

(22) Filed: Dec. 21, 2012

(65) Prior Publication Data

US 2014/0152384 A1   Jun. 5, 2014

Related U.S. Application Data

(60) Provisional application No. 61/732,837, filed on Dec. 3, 2012.

(51) Int. Cl.
| | |
|---|---|
| *H04B 5/00* | (2006.01) |
| *H01P 5/18* | (2006.01) |
| *H01L 25/00* | (2006.01) |
| *H01P 5/04* | (2006.01) |
| *H01Q 13/20* | (2006.01) |
| *H01Q 13/06* | (2006.01) |
| *H01Q 5/00* | (2006.01) |
| *H01P 1/18* | (2006.01) |

(52) U.S. Cl.
CPC .............. *H01L 25/00* (2013.01); *H04B 5/0031* (2013.01); *H01P 5/04* (2013.01); *H01Q 13/206* (2013.01); *H01Q 13/06* (2013.01); *H01Q 5/001* (2013.01); *H01P 1/18* (2013.01); *H01L 2924/0002* (2013.01)

USPC ......... 455/41.1; 455/349; 455/90.2; 333/109; 333/124; 333/156; 333/260

(58) Field of Classification Search
CPC ......... H04B 5/0031; H01P 1/18; H01P 1/184; H01P 5/04; H01L 25/00; H01Q 5/001; H01Q 5/0048; H01Q 13/06; H01Q 13/20; H01Q 13/206
USPC ........ 455/41.1, 41.2, 349; 333/109, 115, 116, 333/124, 156, 260
See application file for complete search history.

(56) References Cited

U.S. PATENT DOCUMENTS

| | | | | |
|---|---|---|---|---|
| 5,138,436 | A * | 8/1992 | Koepf | 257/728 |
| 6,603,915 | B2 * | 8/2003 | Glebov et al. | 385/129 |
| 6,798,314 | B2 * | 9/2004 | Nation | 333/104 |
| 6,909,127 | B2 * | 6/2005 | O'Mahony et al. | 257/208 |
| 6,947,490 | B1 * | 9/2005 | Edwards et al. | 375/261 |
| 8,565,343 | B1 * | 10/2013 | Husted et al. | 375/297 |
| 2003/0001652 | A1 * | 1/2003 | O'Mahony et al. | 327/295 |

(Continued)

*Primary Examiner* — Duc M Nguyen
(74) *Attorney, Agent, or Firm* — McDermott Will & Emery LLP

(57) ABSTRACT

Communication between chips is provided using a transmission line. Any one of the chips may tap into the transmission line, and communicate with another chip tapped into the transmission line by transmitting a radio frequency (RF) signal to the other chip via the transmission line or receiving an RF signal from the other chip via the transmission line. The transmission line may include a microstrip transmission line, a waveguide, a stripline transmission line, or another type of transmission line. The chips may use the transmission line to communicate data, control and/or clock signals with one another.

20 Claims, 10 Drawing Sheets

(56) References Cited

U.S. PATENT DOCUMENTS

| | | | |
|---|---|---|---|
| 2003/0040440 A1* | 2/2003 | Wire et al. | 505/210 |
| 2003/0123598 A1* | 7/2003 | Gollamudi et al. | 375/377 |
| 2005/0054296 A1* | 3/2005 | Chuang et al. | 455/63.1 |
| 2008/0242342 A1* | 10/2008 | Rofougaran | 455/550.1 |
| 2010/0100921 A1* | 4/2010 | Olson et al. | 725/118 |
| 2010/0171563 A1* | 7/2010 | Dupuy et al. | 333/103 |
| 2010/0311332 A1* | 12/2010 | Roufougaran et al. | 455/41.2 |
| 2012/0275122 A1* | 11/2012 | Howard et al. | 361/748 |

\* cited by examiner

TRANSMISSION LINE FOR AN INTEGRATED CIRCUIT PACKAGE

CROSS-REFERENCE TO RELATED APPLICATIONS

The present application claims the benefit of U.S. Provisional Patent Application Ser. No. 61/732,837, entitled "Transmission Line for an Integrated Circuit Package," filed on Dec. 3, 2012, which is hereby incorporated by reference in its entirety for all purposes.

TECHNICAL FIELD

The present description relates generally to transmission lines, and more particularly, to a transmission line for an integrated circuit (IC) package.

BACKGROUND

Multiple chips or dies may be packaged together in a multi-chip integrated circuit (IC) package. The chips in the IC package may communicate with one another via a digital interface. For example, a radio transceiver chip may communicate with a baseband chip in the IC package via a digital interface. The digital interface may include multiple lines for communicating multiple bits in parallel between chips. However, the digital interface may add complexity to the IC package by requiring multiple lines between chips and/or electrostatic discharge (ESD) protection circuitry. Also, the digital interface may suffer from harmonic interference and/or other types of interference.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

Figure 1:
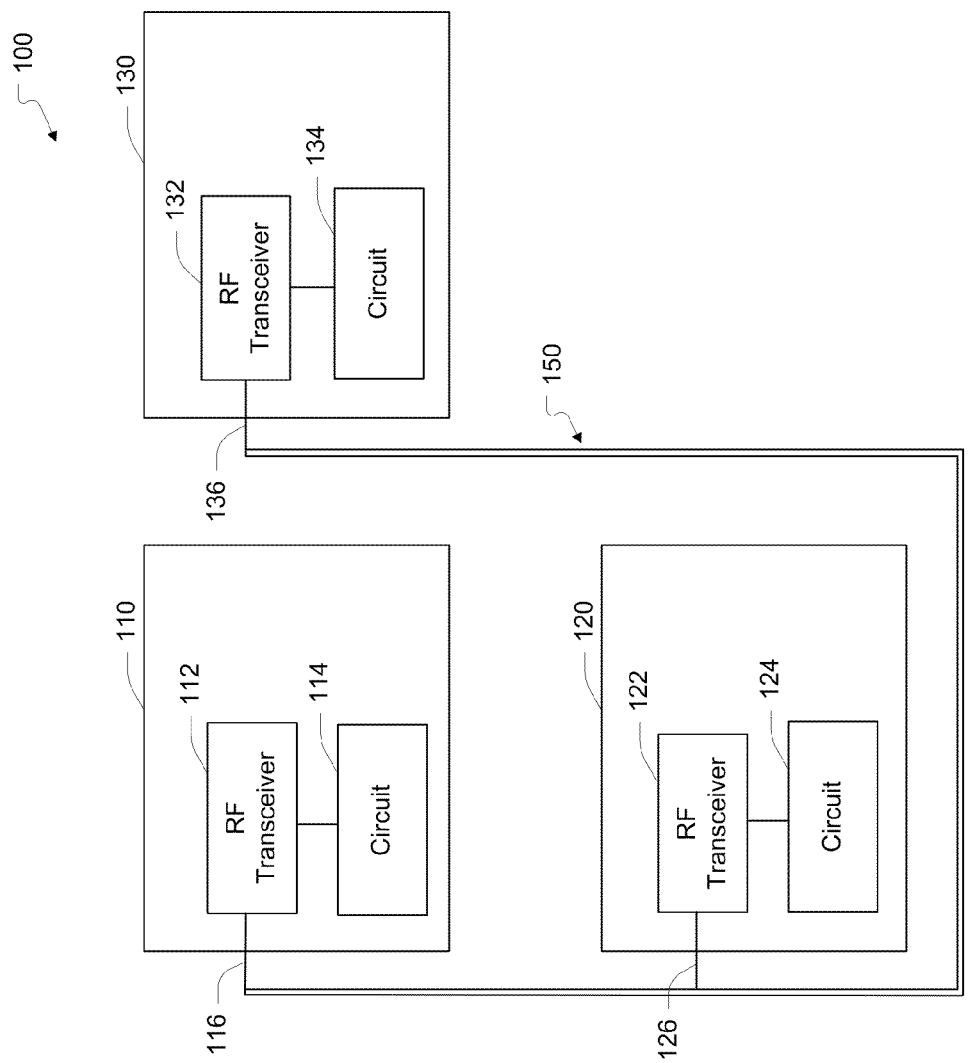
FIG. 1 illustrates an example of a multi-chip IC package according to aspects of the subject technology.

FIG. 1 shows a block diagram of an example IC package 100 according to some aspects of the subject technology. The package 100 includes multiple chips or dies 110, 120 and 130, and a transmission line 150. Although three chips are shown in the example in FIG. 1, it is to be understood that the IC package 100 may include any number of chips. Further, although the chips 110, 120 and 130 are shown side-by-side in FIG. 1 for ease of illustration, it is to be appreciated that the chips 110, 120 and 130 may be stacked on top of one another in the IC package 100 (e.g., in a stacked-die arrangement).

Figure 2:
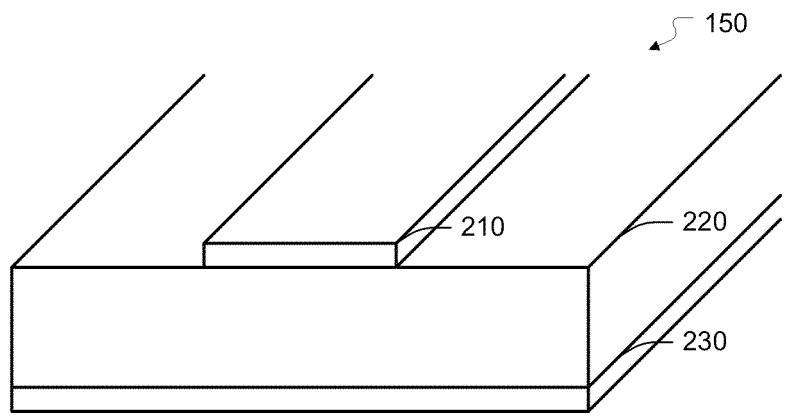
FIG. 2 illustrates an example of a transmission line according to aspects of the subject technology.

The transmission line 150 may be implemented using various types of transmission lines. In some implementations, the transmission line 150 may be a microstrip transmission line. FIG. 2 shows a cross-sectional view of an example microstrip transmission line 150 that includes a flat conductor 210, a ground plane 230, and a dielectric layer 220 between the conductor 210 and the ground plane 230. The ground plane 230 runs parallel to the flat conductor 210, and may include a flat conductor coupled to ground. Although the conductor 210 is shown on top of the dielectric layer 220 in FIG. 2, it is to be appreciated that the dielectric layer 220 may surround the conductor 210. The dielectric layer 220 may include multiple layers made up of different dielectric materials. Examples of other types of transmission lines that may be used with the subject technology include waveguides (e.g., coplanar waveguides), and stripline transmission lines.

The transmission line 150 may be fabricated on a substrate on which the chips 110, 120 and 130 in the package 100 are mounted. The substrate may include a ceramic substrate, a printed circuit board (PCB), a silicon substrate, or another type of substrate. The chips may be coupled to the transmission line by interconnect bumps, wire bonds, or another technique. Alternatively, the transmission line 150 may be integrated on one of the chips in the package, and one or more of the other chips in the package may be coupled to the transmission line by interconnect bumps, wire bonds, or another technique.

Referring back to FIG. 1, each chip 110, 120 and 130 may include a functional circuit 114, 124 and 134, and a radio frequency (RF) transceiver 112, 122 and 132 coupled to the transmission line 150. The RF transceivers 112, 122 and 132 enable the functional circuits 114, 124 and 134 to communicate with one another via the transmission line 150 by transmitting and receiving RF signals on the transmission line 150.

Figure 3:
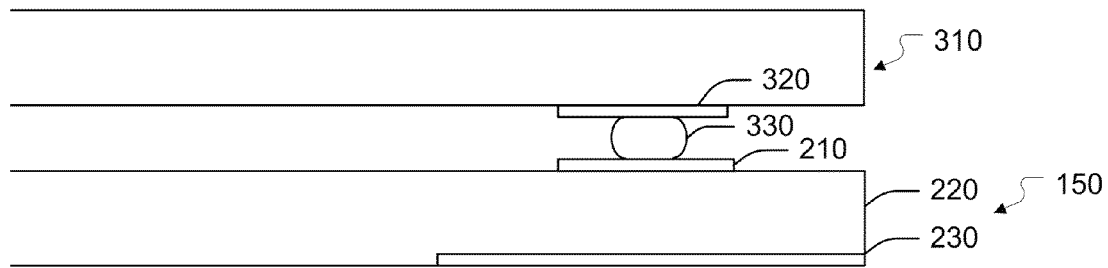
FIG. 3 illustrates an example of a tap to a transmission line according to aspects of the subject technology.

The RF transceivers 112, 122 and 132 are coupled to the transmission line 150 by taps 116, 126 and 136, respectively. In some implementations, a tap may include an interconnect bump, an example of which is shown in FIG. 3. FIG. 3 shows a chip 310 placed over a microstrip transmission line 150 face down in a flip-chip configuration. The chip 310 may be used to implement any one of the chips 110, 120 and 130 shown in FIG. 1. The chip 310 includes a contact 320 that is coupled to the RF transceiver (not shown in FIG. 3) of the chip 310 (e.g., by metal-layer interconnects in the chip). The contact 320 of the chip 310 is coupled to the conductor 210 of the transmission line 150 by an interconnect bump 330, thereby coupling the RF transceiver of the chip 310 to the transmission line 150.

In some implementations, a tap may include a wire bond that is coupled between a contact of a chip and the transmission line 150, in which the contact is coupled to the RF transceiver of the chip. In some implementations, a tap may include a conductor in the chip that runs parallel to the transmission line 150, and is coupled to the RF transceiver. The conductor may inductively couple an RF signal between the conductor and the transmission line 150 without being physically connected to the transmission line 150. Other techniques may be used to couple the RF transceiver of a chip to the transmission line 150.

Referring back to FIG. 1, any one of the functional circuits 114, 124 and 134 may include one or more of a wireless local area network (WLAN) transceiver, a Bluetooth transceiver, a cellular transceiver, a baseband processor, a microprocessor, a hardware accelerator (e.g., a graphics accelerator), and a memory. The functional circuits 114, 124 and 134 communicate with one another via the respective RF transceivers 112, 122 and 132 and the transmission line 150.

When the functional circuit 114, 124 or 134 of one of the chips 110, 120 or 130 needs to send a signal (e.g., data and/or controls) to another functional circuit 114, 124 or 134 of another chip 110, 120 or 130, the respective RF transceiver 112, 122 or 132 processes the signal into an RF signal for transmission on the transmission line 150. The processing may include one or more of modulation, frequency up-conversion, and power amplification. The RF transceiver 112, 122 or 132 transmits the RF signal on the transmission line 150 via the respective tap 116, 126 or 136. Thus, the RF transceiver drives the transmission line 150 with the RF signal rather than transmit the RF signal wirelessly. The RF signal may have a carrier frequency within a range of one GHz to 100 GHz, or another frequency range.

The RF transceiver 112, 122 or 132 of the other chip receives the RF signal from the transmission line 150 via the respective tap 116, 126 or 136. The RF transceiver 112, 122 or 132 may process the received RF signal into a form (e.g., a baseband signal) that can be processed by the respective functional circuit 114, 124 or 134. The processing by the RF transceiver may include one or more of low-noise amplification, frequency down-conversion, and demodulation.

The transmission line 150 may also be used to deliver power (e.g., DC or AC power) to one or more of the chips 110, 120 and 130. The transmission line 150 may also be used to communicate a clock signal from one of the chips to another one of the chips to provide time synchronization between the chips. The transmission line 150 may accommodate the clock signal by, for example, transmitting the RF signals at frequencies that are different from the frequency of the clock signal.

The transmission line 150 provides one or more advantages over a digital interface for providing inter-chip communication. The transmission line 150 enables high-rate signals to be transported on a single line instead of multiple lines, thereby reducing the complexity of the IC package 100, such as by reducing the number of connections, e.g. wires or bondwires, used to provide the high-rate signals and/or to deliver power to one or more of the chips 110, 120, and 130. The reduction of the number of connections may allow the size of the package 100 to be reduced and/or may allow the area of the package 100 that was allocated to the connections to be repurposed.

Furthermore, the transmission line 150 is in a controlled environment, and therefore may not be subject to multi-path fading and interference associated with wireless transmissions. This enables the use of higher-level modulation schemes, increasing throughput. Further, the RF transceivers 112, 122 and 132 may be tuned to transmit and receive signals at specific frequencies, and therefore suppress (attenuate) harmonic interference and lower-frequency ESD signals.

In some implementations, an RF signal on the transmission line 150 may be directed to a particular chip 110, 120 or 130 in the package 100 using time division multiplexing (TDM), frequency division multiplexing (FDM), code division multiplexing (CDMA), packet-based addressing, or another technique.

For TDM implementations, the chips 110, 120 and 130 may be assigned different time slots, and each chip may listen for a signal on the transmission line 150 during its assigned time slots. When a functional circuit 114, 124 or 134 of one of the chips 110, 120 or 130 needs to send a signal (e.g., data and/or controls) to another functional circuit 114, 124 or 134 of another chip 110, 120 or 130, the respective RF transceiver 112, 122 or 132 transmits the corresponding RF signal in a time slot assigned to the other chip. The other chip listens for the signal during the time slot (which is assigned to the other chip), and therefore receives the signal.

One of the functional circuits 114, 124 or 134 may manage TDM communication among the chips. The functional circuit may do this by assigning time slots to the chips 110, 120 or 130, and communicating the assigned time slots to the other chips in the package 100 via the respective RF transceiver 112, 122 or 132 and the transmission line 150. The chips 110, 120 and 130 may be time synchronized, for example, by sending a clock signal from one of the chips to the other chips in the package via the transmission line 150.

For FDM implementations, the chips 110, 120 and 130 may be assigned different RF or carrier frequencies, and each chip may listen for a signal on the transmission line 150 at its assigned RF frequency. When a functional circuit 114, 124 or 134 of one of the chips 110, 120 or 130 needs to send a signal to another functional circuit 114, 124 or 134 of another chip 110, 120 or 130, the respective RF transceiver 112, 122 or 132 may transmit the corresponding RF signal at the RF frequency assigned to the other chip.

One of the functional circuits 114, 124 or 134 may manage FDM communication among the chips. The functional circuit may do this by assigning RF frequencies to the chips 110, 120 or 130, and communicating the assigned RF frequencies to the other chips via the respective RF transceiver 112, 122 or 132 and the transmission line 150.

For CDMA implementations, the chips 110, 120 and 130 may be assigned different codes (e.g., orthogonal codes). When a functional circuit 114, 124 or 134 of one of the chips 110, 120 or 130 needs to send a signal to another functional circuit 114, 124 or 134 of another chip 110, 120 or 130, the respective RF transceiver 112, 122 or 132 may spread the signal with the code assigned to the other chip, and transmit the corresponding RF signal on the transmission line 150. The other chip may receive the RF signal from the transmission line 150, and dispread the RF signal using a corresponding locally-generated code to recover the un-coded signal.

For packet-based addressing implementations, the chips 110, 120 and 130 may be assigned different addresses. When a functional circuit 114, 124 or 134 of one of the chips 110, 120 or 130 needs to send data to another functional circuit 114, 124 or 134 of another chip 110, 120 or 130, the functional circuit 114, 124 or 134 may encapsulate the data into a packet addressed to the other chip. The functional circuit 114, 124 or 134 may address the packet to the other chip by including the address of the other chip in a header of the packet. The respective RF transceiver may then process the packet into an RF signal and transmit the RF signal on the transmission line 150.

The other chip 110, 120 or 130 may receive the packet via the respective RF transceiver 112, 122 or 132. The respective functional circuit 114, 124 or 134 may then compare the address in the header of the packet with its address. If there is a match, then the functional circuit 114, 124 or 134 processes the data in the packet.

In some implementations, when a packet is transmitted on the transmission line 150, the RF transceiver 112, 122 or 132 of a chip 110, 120 or 130 may receive the header of the packet. The respective functional circuit 114, 124 or 134 may then compare the address in the header of the packet with its address. If there is a match, then the functional circuit 114, 124 or 134 may instruct the respective RF transceiver 112, 122 or 132 to receive the rest of the packet, and process the rest of the packet. If there is not a match, then the functional circuit 114, 124 or 134 may instruct the respective RF transceiver 112, 122 or 132 to cease receiving the packet to conserve power. In this case, the functional circuit 114, 124 or 134 may determine that the packet is addressed to another chip, and ignore the rest of the packet.

In some implementations, any one of the RF transceivers 122, 122 and 132 may include one or more impedance matching circuits for matching an input and/or output impedance of the RF transceiver with the impedance of the transmission line 150. Impedance matching may be used to improve the transfer of RF power to and/or from the transmission line 150.

In some implementations, the taps 116, 126 and 136 may be placed at positions on the transmission line 150 that increase the efficiency of RF transmissions between the chips 110, 120 and 130 at selected frequencies. To increase the efficiency of RF transmissions between two chips at a particular RF frequency, the taps of the two chips may be spaced apart on the transmission line 150 such that standing waveforms with certain properties are formed between the two taps when one of the chips transmits an RF signal at the RF frequency.

Figure 4:
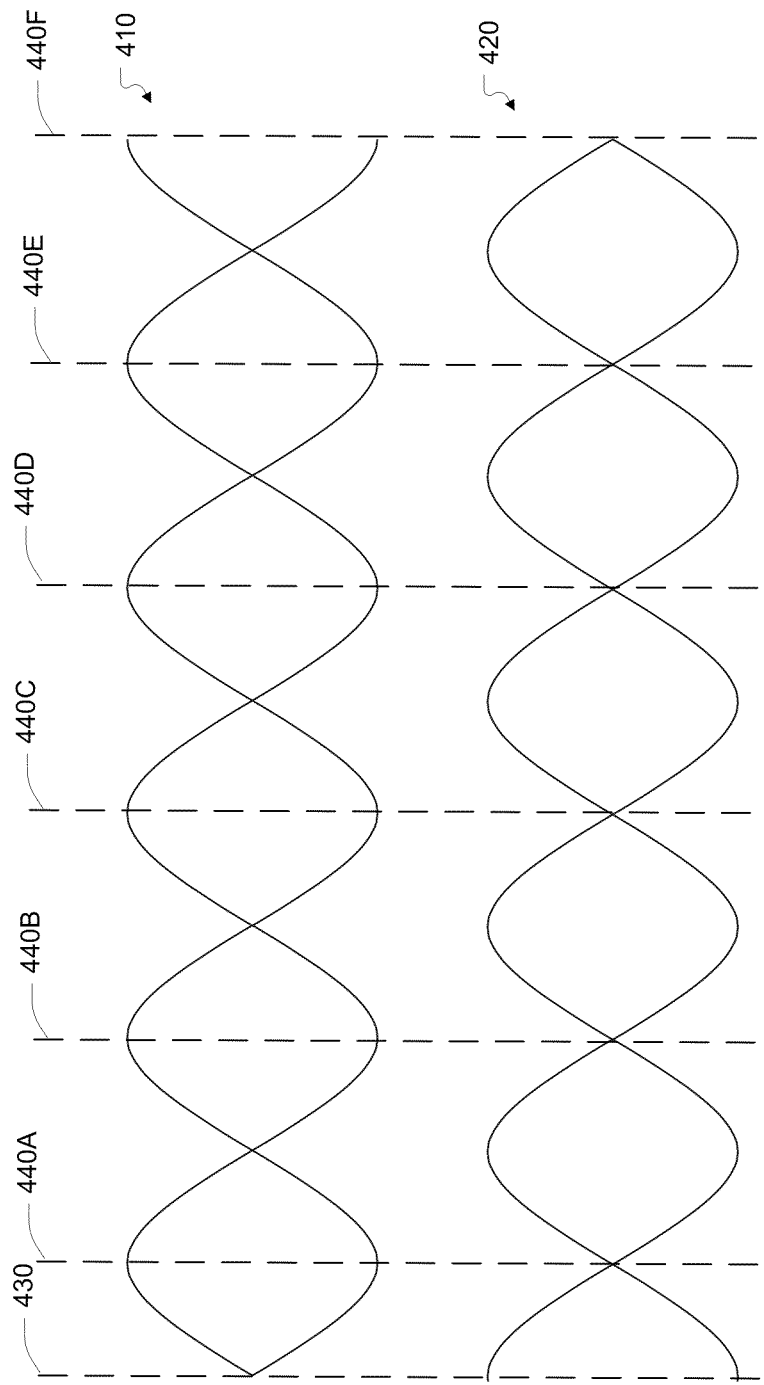
FIG. 4 illustrates an example of a standing voltage waveform and a standing current waveform according to aspects of the subject technology.

In this regard, FIG. 4 shows an example of a standing voltage waveform 410 and a corresponding standing current waveform 420 for a particular RF frequency. The standing waveforms 410 and 420 may be formed by spacing the taps of a transmitting chip and a receiving chip apart by a length of L given by:

$$L = N*(\tfrac{1}{2}\lambda) + \tfrac{1}{4}\lambda \quad (1)$$

where $\lambda$ is the wavelength of the RF signal and N is an integer. As shown in FIG. 4, at position 430 corresponding to the tap of the transmitting chip, the amplitude of the voltage waveform 410 is at a minimum and the amplitude of the current waveform 420 is at a maximum. When the tap of the receiving chip is spaced away from the transmitting chip by a length given by Eq. (1), the tap of the receiving chip may lie at any one of positions 440A-440F shown in FIG. 4. At each of these positions, the amplitude of the voltage waveform 410 is at a maximum and the amplitude of the current waveform 420 is at a minimum. Thus, when the taps of the transmitting chip and the receiving chip are spaced apart by a length given by Eq. (1), the transmitting chip sees an approximate short, and the receiving chip sees an approximate open.

As a result, a power amplifier at the transmitting chip sees a low impedance, enabling the power amplifier to drive a large current on the transmission line 150 with a small voltage swing. This prevents the power amplifier from going into saturation. A low-noise amplifier (LNA) or sense amplifier at the receiving chip sees a large impedance, and therefore a large voltage. This enables the LNA to output a large voltage, thereby improving sensitivity at the receiver. Thus, the efficiency of RF transmissions between two chips can be increased by positioning their taps on the transmission line 150 such that standing waveforms are created therebetween forming an approximate short at the transmitting chip and an approximate open at the receiving chip. This reduces the need for providing impedance matching between the RF transceivers 112, 122 or 132 of the chips 110, 120 and 130 and the transmission line 150.

Figure 5:
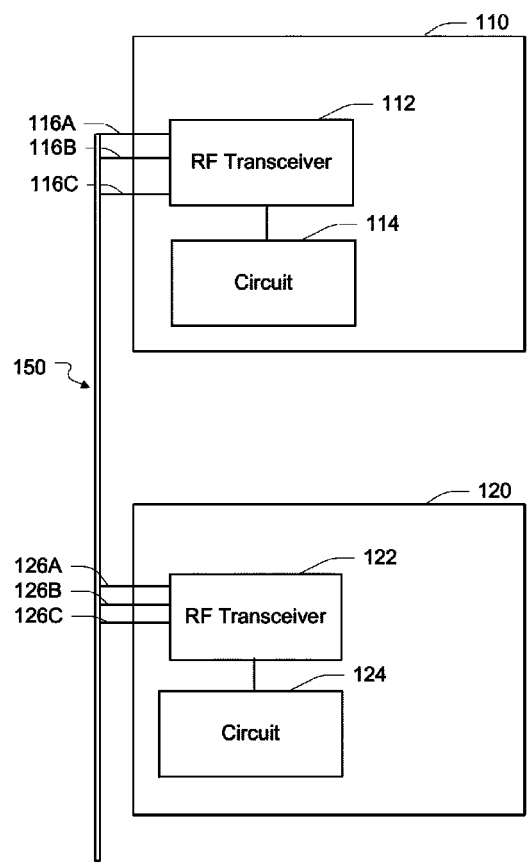
FIG. 5 illustrates an example of a chip that is coupled to a transmission line by multiple taps according to aspects of the subject technology.

In some implementations, the RF transceiver 112, 122 or 132 of a chip 110, 120 or 130 may be coupled to the transmission line 150 by multiple taps to provide efficient RF transmissions at different frequencies. FIG. 5 shows an example in which the RF transceiver 112 of chip 110 is coupled to the transmission line 150 by three taps 116A, 116B and 116C located at different positions on the transmission line 150, and the RF transceiver 122 of chip 120 is coupled to the transmission line 150 by three taps 126A, 126B and 126C located at different positions on the transmission line 150. Although each of chips 110 and 120 has three taps in the example in FIG. 5, it is to be appreciated that any of chips 110 and 120 may have any number of taps.

Different pairs of taps for chips 110 and 120 may be spaced apart by different lengths on the transmission line 150 to provide efficient RF transmissions at different frequencies. For example, tap 116A of chip 110 and tap 126A of chip 120 may be spaced apart by a first length that provides efficient RF transmissions at a first RF frequency (e.g., produces standing waveforms forming an approximate short at one of the chips and an approximate open at the other chip at the first RF frequency). Tap 116B of chip 110 and tap 126B of chip 120 may be spaced apart by a second length that provides efficient RF transmissions at a second RF frequency, and tap 116C of chip 110 and tap 126C of chip 120 may be spaced apart by a third length that provides efficient RF transmissions at a third RF frequency.

Thus, the RF transceiver 112, 122 or 132 of a chip 110, 120 or 130 may be coupled to the transmission line 150 by multiple taps at different positions on the transmission line 150, where each tap may provides efficient RF transmissions at a different RF frequency. This enables two chips to efficiently communicate with each other at different RF frequencies. For example, when two chips that are communicating with each other at a particular RF frequency via the transmission line 150 experience excessive interference (e.g., from another chip or other source), the two chips may switch to another RF frequency for communicating with each other. In another example, two chips may efficiently communicate with each other on multiple RF frequencies simultaneously via the transmission line 150 to increase throughput.

For FDM implementations, the taps of two chips may be located at positions on the transmission line 150 that provide efficient RF transmissions at a desired frequency while suppressing RF transmissions at another frequency used by another chip in the package. For example, tap 116A of chip 110 and tap 126A of chip 120 may be spaced apart by a length that provides efficient RF transmissions between chips 110 and 120 at a first RF frequency. In this example, chips 110 and 120 may communicate with each other via the transmission line 150 at the first RF frequency. Chip 110 may also communicate with chip 130 at a second RF frequency. In this case, the spacing between taps 116A and 126A may provide much less efficient RF transmissions at the second RF frequency (e.g., produces standing waveforms forming shorts at both chips). As a result, RF transmissions intended for chip 130 at the second RF frequency can be substantially reduced at the tap 126A of chip 120, thereby reducing interference between chips 120 and 130.

Figure 6:
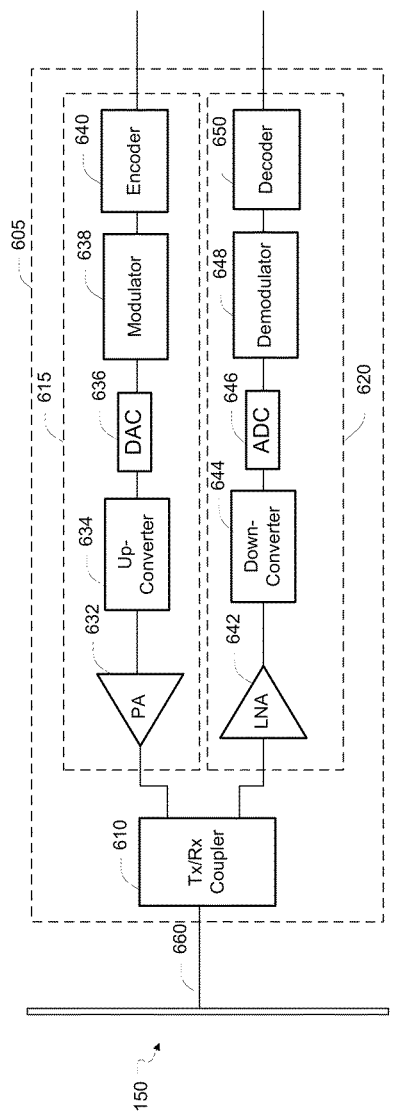
FIG. 6 illustrates an example transceiver according to aspects of the subject technology.

FIG. 6 shows a block diagram of an RF transceiver 605 according to aspects of the subject technology. The RF transceiver 605 may be used to implement any one of the RF transceivers 112, 122 and 132 shown in FIG. 1, and may be coupled to the transmission line 150 by a tap 660. The RF transceiver 605 includes a transmitter 615, a receiver 620, and a Tx/Rx coupler 610. The Tx/Rx coupler 610 couples the transmitter 615 and the receiver 620 to the tap 660 while isolating the transmitter 615 from the receiver 620. The Tx/Rx coupler 610 may be implemented using one or more switches that selectively couple the transmitter 615 and the receiver 620 to the tap 660, a duplexer, one or more filters, etc.

The transmitter 615 may include an encoder 640, a modulator 638, a digital-to-analog converter (DAC) 636, a frequency up-converter 634, and a power amplifier (PA) 632. The encoder 640 receives an input signal (e.g., data signal) from the respective functional circuit. The input signal may include data (e.g., voice, video, text, etc.) to be transmitted to another functional circuit of another chip in the package. The encoder 640 encodes the input signal (e.g., error-correction coding, turbo coding, etc.). The modulator 638 modulates the encoded signal using any one of a variety of modulation schemes, such as amplitude modulation (AM), frequency modulation (FM), phase modulation (PM), amplitude shift keying (ASK), phase shift keying (PSK), quadrature PSK (QPSK), frequency shift keying (FSK), quadrature amplitude modulation (QAM), or another modulation scheme.

The encoder 640 and the modulator 638 may perform encoding and modulation, respectively, in the digital domain, and may be implemented using a digital signal processor (DSP). Although the encoder 640 and the modulator 638 are shown in FIG. 6 as being part of the transceiver 605, it should be appreciated that one or more functions of the encoder 640 and modulator 638 may be performed by the respective functional circuit (e.g., when the functional circuit includes a DSP).

The DAC 636 converts the modulated signal output by the modulator 638 into an analog modulated signal. The analog modulated signal may be at baseband. The frequency up-converter 634 performs frequency up-conversion on the modulated signal to convert the modulated signal into an RF signal. The RF signal may have a frequency within a range of one GHz to 100 GHz. The frequency up-converter 634 may up-convert the frequency of the modulated signal by mixing the modulated signal with a local oscillator signal. The PA 632 amplifies the RF signal. The PA 632 may be omitted if the RF signal already has sufficient power to be reliably transmitted on the transmission line 150. The Tx/Rx coupler 610 couples the RF signal output by the PA 632 to the transmission line 150 via the tap 660.

The receiver 620 includes a low-noise amplifier (LNA) 642, a frequency down-converter 644, an analog-to-digital converter (ADC) 646, a demodulator 648, and a decoder 650. The Tx/Rx coupler 610 couples a receive RF signal from the transmission line 150 to the LNA 642 via the tap 660. The LNA 642 amplifies the receive RF signal. The LNA 642 may be omitted if the receive RF signal has sufficient power to be detected at the receiver 620. The frequency down-converter 644 performs frequency down-conversion on the RF signal to convert to the RF signal to a baseband signal. The ADC 646 converts the baseband signal into a digital baseband signal.

The demodulator 648 demodulates the baseband signal in accordance with the modulated scheme used by the corresponding transmitter. The decoder 650 decodes the demodulated signal, and outputs the decoded signal to the respective functional circuit for further processing. The receiver 620 may include one or more additional amplifier stages (not shown), and/or a filter (not shown) to, for example, remove out-of-band signals.

The demodulator 648 and the decoder 650 may be implemented using a digital signal processor (DSP). Although the demodulator 648 and the decoder 650 are shown in FIG. 6 as being part of the transceiver 605, it should be appreciated that one or more functions of the demodulator 648 and decoder 650 may be performed by the respective functional circuit (e.g., when the functional circuit includes a DSP).

Figure 7:
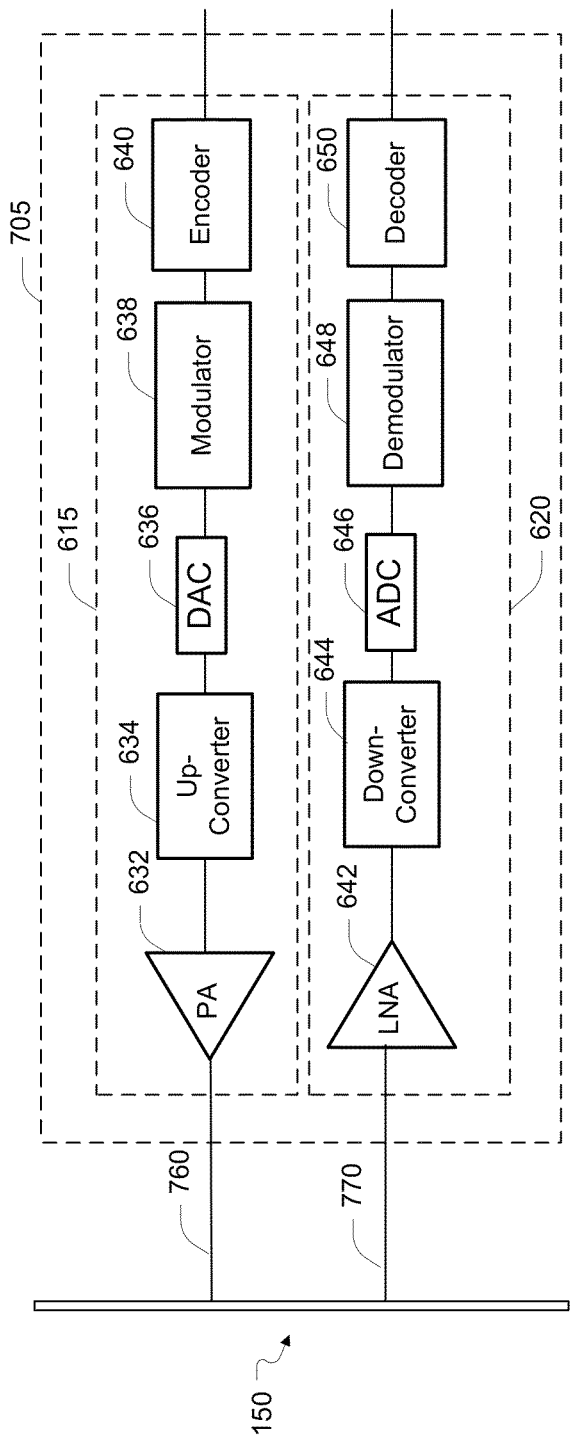
FIG. 7 illustrates an example transceiver that includes a receiver and a transmitter coupled to a transmission line by different taps according to aspects of the subject technology.

FIG. 7 shows a block diagram of an RF transceiver 705 according to aspects of the subject technology. The RF transceiver 705 includes a transmitter 615 coupled to the transmission line 150 via a first tap 760, and a receiver 620 coupled to the transmission line 150 via a second tap 770. The first tap 760 and the second tap 770 may be located at different positions on the transmission line 150, as shown in the example in FIG. 7.

Figure 8:
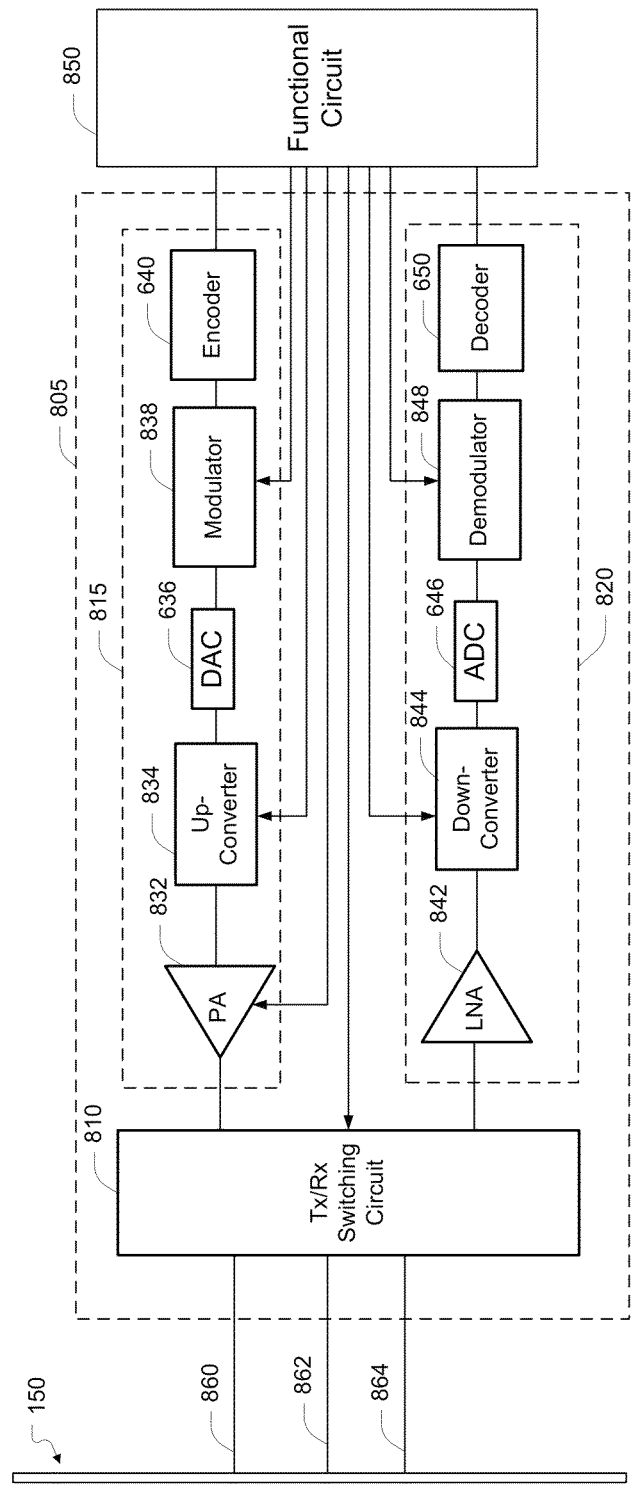
FIG. 8 illustrates an example transceiver that is coupled to a transmission line by multiple taps according to aspects of the subject technology.

FIG. 8 shows a block diagram of an RF transceiver 805 according to aspects of the subject technology. The RF transceiver 805 may be used to implement any one of the RF transceivers 112, 122 and 132 shown in FIG. 1, and may be coupled to the transmission line 150 via a first tap 860, a second tap 862, and a third tap 864. The taps 860, 862 and 864 are located at different positions on the transmission line 150, and may provide efficient RF transmissions at different frequencies. For example, the first tap 860, the second tap 862, and the third tap 864 may provide efficient RF transmissions at a first RF frequency, a second RF frequency and a third RF frequency, respectively.

The RF transceiver 805 includes a transmitter 815, a receiver 820, and a Tx/Rx switching circuit 810. The Tx/Rx switching circuit 810 is configured to selectively couple the transmitter 815 and the receiver 820 to the taps 860, 862 and 864. In some implementations, the respective functional circuit 850 controls the Tx/Rx switching circuit 810 based on which RF frequency is to be used by the transmitter 815 and/or receiver 820. When the transmitter 815 transmits an RF signal at the first RF frequency, the functional circuit 850 may instruct the switching circuit 810 to couple the transmitter 815 to the first tap 860. When the transmitter 815 transmits an RF signal at the second RF frequency, the functional circuit 850 may instruct the switching circuit 810 to couple the transmitter 815 to the second tap 862. When the transmitter 815 transmits an RF signal at the RF third frequency, the functional circuit 850 may instruct the switching circuit 810 to couple the transmitter 815 to the third tap 864. The same may apply for the receiver 820.

The transmitter 815 may include an adjustable power amplifier (PA) 832 having an adjustable output power. The output power of the PA 832 may be adjusted by adjusting a bias voltage in the PA 832, or another technique.

The transmitter 815 may also include an adjustable up-converter 834 having an adjustable frequency. In some implementations, the adjustable up-converter 834 may include a frequency synthesizer that outputs a reference signal having an adjustable frequency, and a mixer that mixes the modulated signal with the reference signal to up-convert the modulated signal. The frequency of the reference signal may be made adjustable using a voltage-controlled oscillator (VCO), a programmable frequency divider, and/or another technique. The functional circuit 850 may adjust the frequency of the RF signal by adjusting the frequency of the reference signal output by the frequency synthesizer accordingly. Thus, the functional circuit 850 may tune the frequency of the RF signal by adjusting the frequency of the reference signal.

The transmitter 815 may also include an adjustable modulator 838 having an adjustable modulation scheme. The modulator 838 may support different modulation schemes, and the functional circuit 850 may instruct the modulator which of the modulation schemes to use to modulate a signal. In some implementations, the modulator 838 may support different levels of modulation (e.g., QPSK, 16 QAM, 64-QAM, and 256-QAM), and the functional circuit 850 may instruct the modulator which level of modulation to use to modulate a signal. Higher levels of modulation may be capable of providing high throughput, while lower levels of modulation may be more robust to interference and distortion.

The receiver 820 may include an adjustable LNA 842 having an adjustable gain. The gain of the LNA 842 may be adjusted by adjusting a bias voltage applied to the LNA 842, or another technique.

The receiver 820 may also include an adjustable down-converter 844 having an adjustable frequency. In some implementations, the adjustable down-converter 844 may include a frequency synthesizer that outputs a reference signal having an adjustable frequency, and a mixer that mixes a received RF signal with the reference signal to down-convert the RF signal (e.g., to baseband). The functional circuit 850 may tune the frequency of a receive RF signal by adjusting the reference signal output by the frequency synthesizer accordingly.

The receiver 820 may also include an adjustable demodulator 848 having an adjustable demodulation scheme. The demodulator 848 may support different demodulation schemes, and the functional circuit 850 may instruct the demodulator 848 which of the demodulation schemes to use to demodulate a signal. For example, the functional circuit 850 may instruct the demodulator 848 to use a demodulation scheme corresponding to the modulation scheme used to modulate the corresponding signal.

In some implementations, the functional circuit 850 may be configured to adjust the transmission power of the RF transceiver 805 based on the data rate of the signal to be transmitted. To do this, the functional circuit 850 may adjust the output power of the PA 832 based on the data rate of the signal to be transmitted. The functional circuit 850 may reduce the output power of the PA 832 for lower data rates since lower data rates may be more reliability transmitted on the transmission line 150 at lower power than higher data rates.

In some implementations, the functional circuit 850 may be configured to adjust the transmission power of the RF transceiver 805 based on an error rate (e.g., frame error rate) reported by the receiving chip. The functional circuit 850 may receive the error rate via the transmission line 150. The functional circuit 850 may then compare the reported error rate with a threshold. When the reported error rate exceeds the threshold, the functional circuit 850 may increase the output power of the PA 832 to reduce the error rate.

In some implementations, the functional circuit 850 may adjust the level of modulation used by the modulator 838 based on the data rate to be transmitted. The functional circuit 850 may instruct the modulator 838 to use a higher level of modulation for higher data rates.

In some implementations, the functional circuit 850 may adjust the level of modulation used by the modulator 838 based on an error rate reported by the receiving chip. A lower level of modulation may be more robust than a higher level of modulation at the expense of less throughput. Thus, when the error rate reported by the receiving chip exceeds a threshold, the functional circuit 850 may instruct the modulator 838 to reduce the level of modulation to reduce the error rate.

In the above implementations, the portion of the functional circuit 850 that controls the various parameters of the transceiver 805 may be referred to as a controller.

Figure 9A:
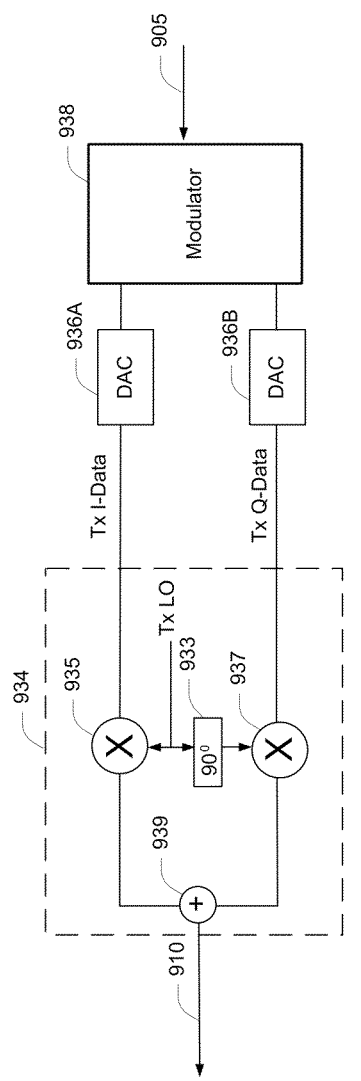
FIG. 9A illustrates an example transmitter according to aspects of the subject technology.

FIG. 9A shows a frequency up-converter 934 and a modulator 938 according to aspects of the subject technology. The up-converter 934 and the modulator 938 may be used in any of the transmitters 615 and 815 shown in FIGS. 6-8. The modulator 938 receives a signal 905 to be transmitted on the transmission line 150. The signal 905 may be from the encoder 640 or another circuit. The modulator 938 modulates the signal using an inphase-quadrature (I-Q) modulation scheme, such as QPSK, 16 QAM, 64-QAM, and 256-QAM. The modulator 938 outputs transmit (Tx) inphase (I)-data and transmit (Tx) quadrature (Q)-data, both in the digital domain. Digital-to-analog converters (DACs) 936A and 936B convert the Tx I-data and the Tx-Q data, respectively, into analog signals. The analog Tx I-data and Tx Q-data may be at baseband.

The frequency up-converter 934 includes a first mixer 935, a second mixer 937, a 90-degree phase shifter 933, and a combiner 939. The first mixer 935 mixes the Tx I-data with a transmit local oscillator (TxLO) signal to up-convert the Tx I-data. The phase shifter 933 shifts the TxLO signal by 90 degrees. The second mixer 937 mixes the Tx Q-data with the phase-shifted TxLO signal to up-convert the Tx Q-data. The combiner 939 combines the up-converted Tx I-data and the up-converted Tx-Q data to produce the RF signal 910 to be transmitted on the transmission line 150. The RF signal 910 may be power amplified by the PA 632 or 832 prior to transmission on the transmission line 150.

Figure 9B:
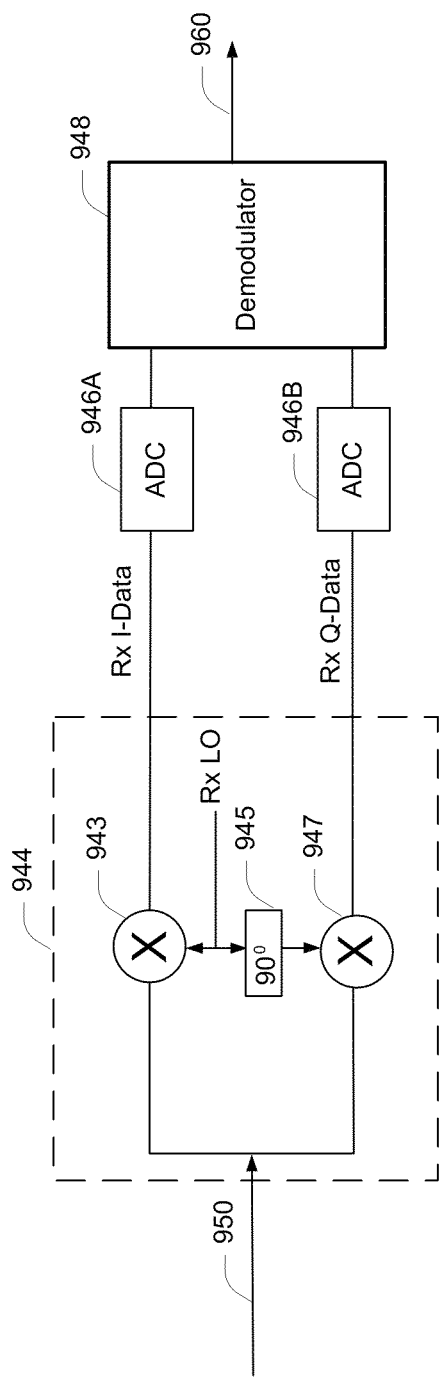
FIG. 9B illustrates an example receiver according to aspects of the subject technology.

FIG. 9B shows a frequency down-converter 944 and a demodulator 948 according to aspects of the subject technology. The down-converter 944 and the demodulator 948 may be used in any of the transmitters 615 and 815 shown in FIGS. 6-8.

The frequency down-converter 944 includes a first mixer 943, a second mixer 947, and 90-degree phase shifter 945. The first mixer 943 mixes a receive RF signal 950 with a receive local oscillator (RxLO) signal to down-convert the RF signal 950 into receive (Rx) I-data. The phase shifter 945 shifts the RxLO signal by 90 degrees. The second mixer 947 mixes the receive RF signal 950 with the phase-shifted RxLO signal to down-convert the RF signal 950 into Rx Q-data. The receive RF signal 950 may be output by the LNA 642 of the receiver, and the Rx I-data and Rx Q-data may be at baseband.

The Rx I-data and Rx Q-data may be digitized by analog-to-digital converters 946A and 946B, respectively. The demodulator 948 demodulates the digital Rx I-data and digital Rx Q-data to obtain a data signal 960. The data signal may be output to the decoder 650 or another circuit.

The functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry.

Some implementations can include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

Some implementations can be performed by a microprocessor or multi-core processors that execute software. Some implementations can be performed by one or more integrated circuits, such as application specific integrated circuits (ASICs) or field programmable gate arrays (FPGAs). In some implementations, such integrated circuits can execute instructions that are stored on the circuit itself.

Many of the above-described features and applications may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waveforms and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:
1. An integrated chip (IC) package, comprising:
a transmission line;
a first chip including a first radio frequency (RF) transceiver coupled to the transmission line at a first position; and a second chip including a second RF transceiver coupled to the transmission line at a second position;

wherein the first and second RF transceivers are configured to communicate with one another by transmitting and receiving RF signals on the transmission line; and wherein the first RF transceiver is configured to transmit a first RF signal having a first frequency to the second RF transceiver, and the first and second positions are spaced apart on the transmission line such that a standing wave is generated between the first and second positions when the first RF transceiver transmits the first RF signal, the standing wave forming an approximate short at the first position and an approximate open at the second position.

2. The IC package of claim 1, wherein the transmission line comprises:
a conductor;
a ground plane; and
a dielectric layer between the conductor and the ground plane.

3. The IC package of claim 2, wherein the conductor is substantially flat and runs substantially parallel to the ground plane.

4. The IC package of claim 2, wherein the transmission line is integrated on a substrate, and the first chip and the second chip are mounted on the substrate.

5. The IC package of claim 1, wherein the first chip comprises a controller, the first RF transceiver comprises a power amplifier having an adjustable output power, and the controller is configured to adjust the output power of the power amplifier based on at least one of a data rate of an RF signal to be transmitted to the second RF transceiver via the transmission line and an error rate at the second RF transceiver.

6. The IC package of claim 1, wherein the first chip comprises a controller, the first RF transceiver comprises a modulator having an adjustable modulation scheme, and the controller is configured to adjust the modulation scheme of the modulator based on at least one of a data rate of an RF signal to be transmitted to the second RF transceiver via the transmission line, and an error rate at the second RF transceiver.

7. An integrated chip (IC) package, comprising:
a transmission line;
a first chip including a first radio frequency (RF) transceiver coupled to the transmission line at a first position;
a second chip including a second RF transceiver coupled to the transmission line at a second position; and
a third chip including a third RF transceiver coupled to the transmission line;
wherein the first, second and third RF transceivers are configured to communicate with one another by transmitting and receiving RF signals on the transmission line; and
wherein the first RF transceiver is configured to transmit a first RF signal having a first frequency to the second RF transceiver, and the first and second positions are spaced apart on the transmission line such that a standing wave is generated between the first and second positions when the first RF transceiver transmits the first RF signal, the standing wave forming an approximate short at the first position and an approximate open at the second position.

8. The IC package of claim 7, wherein the first RF transceiver is configured to transmit the first RF signal having the first frequency to the second RF transceiver via the transmission line, and to transmit the second RF signal having a second frequency to the third RF transceiver via the transmission line.

9. The IC package of claim 7, wherein the first RF transceiver is configured to transmit, during a first time slot, the first RF signal to the second RF transceiver via the transmission line, and to transmit, during a second time slot, a second RF signal to the third RF transceiver via the transmission line.

10. The IC package of claim 7, wherein the first RF transceiver is configured to spread the first RF signal with a first code assigned to the second chip, to spread a second RF signal with a second code assigned to the third chip, and to transmit the first and second RF signals on the transmission line.

11. The IC package of claim 7, wherein the first RF transceiver is configured to transmit the first RF signal and a second RF signal on the transmission line, the first RF signal including a first address assigned to the second chip and the second RF signal including a second address assigned to the third chip.

12. The IC package of claim 7, wherein the transmission line comprises:
a conductor;
a ground plane; and
a dielectric layer between the conductor and the ground plane.

13. The IC package of claim 12, wherein the conductor is substantially flat and runs substantially parallel to the ground plane.

14. The IC package of claim 12, wherein the transmission line is integrated on a substrate, and the first, second and third chips are mounted on the substrate.

15. An integrated chip (IC) package, comprising:
a transmission line;
a first tap coupled to the transmission line at a first position on the transmission line;
a second tap coupled to the transmission line at a second position on the transmission line, the second position being spaced apart from the first position;
a first chip, wherein the chip comprises:
a first radio frequency (RF) transceiver;
a coupling switch configured to selectively couple the first RF transceiver to the first tap and the second tap; and
a controller configured to control the coupling switch; and
a second chip comprising a second RF transceiver coupled to the transmission line at a third position;
wherein the first RF transceiver is configured to transmit a first RF signal having a first frequency to the second RF transceiver, and the first and third positions are spaced apart on the transmission line such that a standing wave is generated between the first and third positions when the first RF transceiver transmits the first RF signal, the standing wave forming an approximate short at the first position and an approximate open at the third position.

16. The IC package of claim 15, wherein the controller is configured to instruct the coupling switch to couple the RF transceiver to the first tap when the RF transceiver is to transmit the first RF signal having the first frequency on the transmission line, and to instruct the coupling switch to couple the RF transceiver to the second tap when the RF transceiver is to transmit a second RF signal having a second frequency on the transmission line.

17. The IC package of claim 15, wherein the transmission line comprises:
a conductor;
a ground plane; and
a dielectric layer between the conductor and the ground plane.

18. The IC package of claim 17, wherein the conductor is substantially flat and runs substantially parallel to the ground plane.

19. The IC package of claim 17, wherein the first tap comprises a first interconnect bump between the first chip and the conductor of the transmission line, and the second tap comprises a second interconnect bump between the first chip and the conductor of the transmission line.

20. The IC package of claim 17, wherein the transmission line is integrated on a substrate, and the first chip and the second chip are mounted on the substrate.

* * * * *